United States Patent
Jung et al.

(10) Patent No.: US 8,433,268 B2
(45) Date of Patent: Apr. 30, 2013

(54) APPARATUS AND METHOD FOR CONTROLLING GAIN OF POLAR TRANSMITTER

(75) Inventors: Jae-Ho Jung, Daejeon (KR); Joon-Hyung Kim, Daejeon (KR); Kwang-Chun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 96 days.

(21) Appl. No.: 13/132,537

(22) PCT Filed: Oct. 29, 2009

(86) PCT No.: PCT/KR2009/006289
§ 371 (c)(1),
(2), (4) Date: Jun. 2, 2011

(87) PCT Pub. No.: WO2010/064791
PCT Pub. Date: Jun. 10, 2010

(65) Prior Publication Data
US 2011/0237210 A1    Sep. 29, 2011

(30) Foreign Application Priority Data
Dec. 2, 2008  (KR) .................. 10-2008-0120954

(51) Int. Cl.
*H04B 1/04* (2006.01)
(52) U.S. Cl.
USPC ............... 455/127.2; 455/127.1; 455/127.3; 455/114.2; 455/114.3; 330/133; 330/124 R
(58) Field of Classification Search ............... 455/127.2, 455/127.3, 127.1, 114.3, 114.2; 330/124 R
See application file for complete search history.

(56) References Cited

U.S. PATENT DOCUMENTS

| 7,139,534 | B2 * | 11/2006 | Tanabe et al. ............. 455/108 |
| 2002/0067773 | A1 | 6/2002 | Jackson et al. |
| 2004/0266366 | A1 * | 12/2004 | Robinson et al. ............. 455/91 |

(Continued)

FOREIGN PATENT DOCUMENTS

| JP | 07-288485 A | 10/1995 |
| WO | WO 02/103912 A1 | 12/2002 |
| WO | WO 2006/118318 A1 | 11/2006 |

OTHER PUBLICATIONS

International Search Report for PCT/KR2009/006289 filed on Oct. 29, 2009.
Written Opinion of the International Searching Authority for PCT/KR2009/006289 filed on Oct. 29, 2009.

*Primary Examiner* — Sanh Phu

(57) ABSTRACT

Disclosed is an apparatus for transmitting complex signals in a wireless communication system. The present invention, there is provided a method for controlling gain according to a magnitude change of output signals in a polar transmitter including an amplification unit having two or more amplification degrees, the method includes processes to control an output level of a modulated signal when a output-required power of transmission signals are less than a predetermined threshold value, and to perform a basic amplification through the amplification unit; to amplify the amplification unit at a first amplification level when the output-required power of the transmission signals is equal to or greater than a predetermined first threshold value and is less than a predetermined second threshold value; and to amplify the amplification unit at a second amplification level when the output-required power of the transmission signal is equal to or greater than the second threshold value.

8 Claims, 6 Drawing Sheets

U.S. PATENT DOCUMENTS

| | | |
|---|---|---|
| 2005/0190854 A1 | 9/2005 | Shakeshaft et al. |
| 2005/0271161 A1 | 12/2005 | Staszewski et al. |
| 2007/0160164 A1 | 7/2007 | Sahota |
| 2007/0247217 A1* | 10/2007 | Sorrells et al. .................... 330/2 |
| 2007/0298734 A1 | 12/2007 | Woo et al. |
| 2009/0311980 A1* | 12/2009 | Sjoland .................... 455/127.3 |

* cited by examiner

APPARATUS AND METHOD FOR CONTROLLING GAIN OF POLAR TRANSMITTER

TECHNICAL FIELD

The present invention relates to a signal transmission apparatus for a wireless communication system; and, more particularly, to an apparatus for transmitting complex signals in a wireless communication system.

BACKGROUND ART

Generally, a wireless communication system encodes and modulates an original signal, and transmits the encoded and modulated signal. Such a wireless communication system uses a method of dividing a signal into different phase components and transmitting the phase components, or a method of dividing a signal into magnitude information and phase information and transmitting the magnitude information and the phase information.

A transmitter which divides a signal for transmission into the phase information and the magnitude information to transmit it is called a polar transmitter. When the polar transmitter transmits a signal, it does not divide the signal into an in-phase component, which is an I channel component, and a quadrature-phase component, which is a Q channel component and the signal is divided into the phase information and the magnitude information to be transmitted.

In the polar transmitter, a phase signal component is applied to a power amplifier as a signal which always has a predetermined magnitude through a phase modulator and a magnitude signal component is configured for a final Radio Frequency (RF) output to be a complex transmission signal by varying the power supply voltage of the power amplifier.

The general configuration and operation of the polar transmitter will be described with reference to FIG. 1.

FIG. 1 is a block diagram of a general polar transmitter.

Referring to FIG. 1, the polar transmitter includes a modulator 101, a digital signal processor 102, a phase modulator 103, a digital amplifier 104, and an antenna 105.

The modulator 101 receives data from an upper layer. In this way, the data provided to the modulator 101 is provided together with physical channel configuration information for the transmission of data from the upper layer. At this point, the modulator 101 modulates the received data.

When the modulator 101 modulates the data for transmission, the data are modulated according to the physical channel configuration information provided from the upper layer. Output data which are modulated by modulating in this way are illustrated as I(t) and Q(t) in FIG. 1. The signals I(t) and Q(t), which are complex digital signals outputted from the modulator 101, are inputted to the digital signal processor 102. Then, the digital signal processor 102 separates a phase information signal (θ) and a magnitude information signal from the input complex transmission data, and outputs the separated signals.

The phase information signal (θ) which is extracted and outputted by the digital signal processor 102 is inputted to the phase modulator 103, and the magnitude information signal is processed in a predetermined method and is inputted as a signal for the control of the digital amplifier 104. The phase modulator 103 outputs the phase-modulated RF signal by using the input phase information signal (θ). Herein, the phase modulator 103 may be implemented with a digital oscillator using a digital phase locked loop, and consequently outputs a phase-modulated wireless signal according to the input phase information signal (θ).

As another example, the phase modulator 103 may be implemented with a complex wireless modulator. In this way, in a case where the phase modulator 103 is implemented with the complex wireless modulator, the digital signal processor 102 must calculate and output a sine value and a cosine value. Therefore, the phase modulator 103 implemented with the complex wireless modulator generates and outputs a phase-modulated wireless signal by using an input sine value and an input cosine value.

The magnitude information signal extracted from the digital signal processor 102 may apply a Direct Current (DC) power supply voltage to the digital amplifier 104 through a rectifier (not shown in FIG. 1). At this point, the magnitude information signal extracted from the digital signal processor 102 may be a pulse type of an output signal through a Delta Sigma Modulator (DSM) or a Pulse Width Modulator (PWM) (not shown in FIG. 1), and a pulse width is determined according to the magnitude of a signal. The signal of pulse type is applied to the digital amplifier 104. The digital amplifier 104 performs switching onto the signal outputted from the phase modulator 103 based on a pulse-type control signal obtained in the DSM or PWM from magnitude information.

That is, the control signal of the pulse type outputted from DSM or PWM determines the amplification degree of the digital amplifier 104. The digital amplifier 104 can obtain a final output of the multiplication type of the phase-modulated RF signal and the magnitude information signal via a series of the processes. The signal, which is obtained from the digital amplifier 104 as the final output, passes through a band-pass filter (not shown in FIG. 1) and thereafter is finally radiated through the antenna 105.

As described above, the polar transmitter divides the signal for transmission into the phase signal component (θ) and the magnitude signal component. The magnitude signal component may go through one of the two methods as described above.

The first method is to apply the magnitude signal component to the digital amplifier 104 as a DC voltage by using a rectifier. However, in a case where the magnitude information is applied to the digital amplifier 104 as the DC voltage by using the rectifier, it is difficult to increase the switching speed of the rectifier when the bandwidth of the magnitude information is broadband, and efficiency is considerably decreased.

The second method is to use a delta sigma modulation scheme or a pulse width modulation scheme for transmitting the magnitude signal component. In the two schemes, the sampling speed of a signal must be implemented at very high speed in a digital domain for suppressing the increase of a noise or a spurious signal. Moreover, in a case where the magnitude of a transmitted signal is variable, the performance of DSM or PWM is considerably deteriorated in a system requiring the control of a transmission power.

DISCLOSURE OF INVENTION

Technical Problem

An embodiment of the present invention is directed to providing an apparatus and method for controlling gain, which can increase the switching speed of an amplifier upon power amplification of a transmission signal in a polar transmitter.

Another embodiment of the present invention is directed to providing an apparatus and method for controlling gain, which can suppress the increase of a noise and a spurious signal without highly increasing the sampling speed of a digital-domain signal in a polar transmitter.

Another embodiment of the present invention is directed to providing an apparatus and method for controlling gain, which can decrease the deterioration of performance upon power control of a transmission signal in a polar transmitter.

Other objects and advantages of the present invention can be understood by the following description, and become apparent with reference to the embodiments of the present invention. Also, it is obvious to those skilled in the art of the present invention that the objects and advantages of the present invention can be realized by the means as claimed and combinations thereof.

Solution to Problem

In accordance with an embodiment of the present invention, there is provided an apparatus for controlling gain according to a magnitude change of an output signal in a polar transmitter, the apparatus includes a signal generating unit configured to receive and modulate a transmission signal, separate the modulated signal into a phase signal and a magnitude signal, generate a pulse signal by using the magnitude signal, and convert the phase signal into a wireless signal; a gain correcting unit configured to extract a transmission gain from magnitude information of a resource block of the transmission signal, provide a gain value to the signal generating unit, and generate an envelope signal for a power amplification by using the pulse signal of the signal generating unit; a power amplifying module configured to receive the envelope signal, and perform a power amplification or a simple amplification according to a selection signal and the envelope signal; and a gain controlling unit configured to determine a magnitude of a signal generated by the signal generating unit by using a power control signal for the transmission signal, determine a gain mode, and output the selection signal.

In accordance with another embodiment of the present invention, there is provided a method for controlling gain according to a magnitude change of an output signal in a polar transmitter including an amplification unit having two or more amplification degrees, the method includes processes to control an output level of a modulated signal when a output-required power of a transmission signal is less than a predetermined threshold value, and performing a basic amplification through the amplification unit; to amplify the amplification unit at a first amplification level when the output-required power of the transmission signal is equal to or greater than a predetermined first threshold value and is less than a predetermined second threshold value; and to amplify the amplification unit at a second amplification level when the output-required power of the transmission signal is equal to or greater than the second threshold value.

Advantageous Effects of Invention

Embodiments of the present invention relate to an apparatus and method for controlling gain, which efficiently correct the change of magnitude information according to the bandwidth of a signal in a polar transmitter that divides a complex transmission signal into magnitude information and phase information to transmit it, and correct a magnitude signal error and control a transmission power in a polar transmitter enabling a wide range of a transmission gain control, in a wireless system.

In a polar transmitter according to the prior art, when the magnitude of the output signal of a modulator is increased or decreased, the input signal of a Delta Sigma Modulator (DSM) or a Pulse Width Modulator (PWM) is changed so that performance is deteriorated, and thus a noise component or the magnitude of a spurious component is increased in a power spectrum of a final output Radio Frequency (RF) signal.

Accordingly, although the magnitude of the output signal of a modulator is increased or decreased, embodiments of the present invention can correct a gain correction not to deteriorate the performance of DSM or PWM without changing the entire gain of a transmitter.

Moreover, the conventional polar transmitter varies the power supply voltage level of a class E amplifier or the power supply voltage level of a class AB power amplifier to vary the gain thereof. However, in a case of the conventional polar transmitter, a variable region is narrow, and it is difficult to expect the high-efficiency of an amplifier.

On the other hand, embodiments of the present invention expand a power control range and operate a power amplifier suitable for a transmission output, thereby increase the efficiency of a transmitter.

BEST MODE FOR CARRYING OUT THE INVENTION

Figure 1:
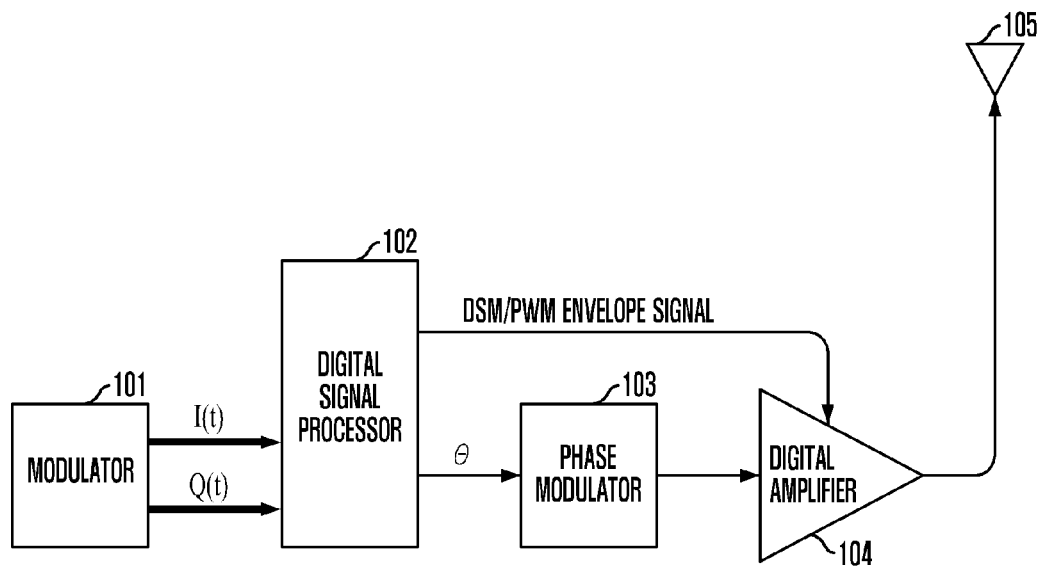
FIG. 1 is a block diagram of a general polar transmitter.

Exemplary embodiments of the present invention capable of being easily embodied by those skilled in the art will now be described in detail with reference to the accompanying drawings. The invention may, however, be embodied in many different forms and should not be construed as being limited to the embodiments set forth herein. In the accompanying drawings, a portion irrelevant to a description of the present invention will be omitted for clarity. Moreover, like reference numerals refer to like elements throughout.

In the present invention described below, the following description will be made on an apparatus and method for solving limitations described in the background art. Embodiments of the present invention improves the performance deterioration of a Delta Sigma Modulator (DSM) or a Pulse Width Modulator (PWM) when the magnitude information of a complex signal is varied due to the bandwidth variation of a transmission signal and a resource allocation like the polar transmission system according to the present invention. For this, embodiments of the present invention use a correction scheme that controls the magnitude of an input signal of DSM or PWM by using information associated with an amount of the power change of a transmitted signal.

Moreover, embodiments of the present invention provide a control algorithm for increasing a variation range of a transmission gain in a polar transmission system. That is, embodiments of the present invention vary the transmission gain of a class E/F amplifier, which may be designed as a relative high-efficiency amplifier, by varying the output magnitude of DSM or PWM, and provide a method that expands a variable range of a maximum power by directly controlling the power supply voltage of a class AB power amplifier in a section of a transmission power level which is approximately 20 dB lower than a maximum output.

Embodiments of the present invention will become apparent from the following description of the embodiments with reference to the accompanying drawings, which is set forth hereinafter.

Figure 2:
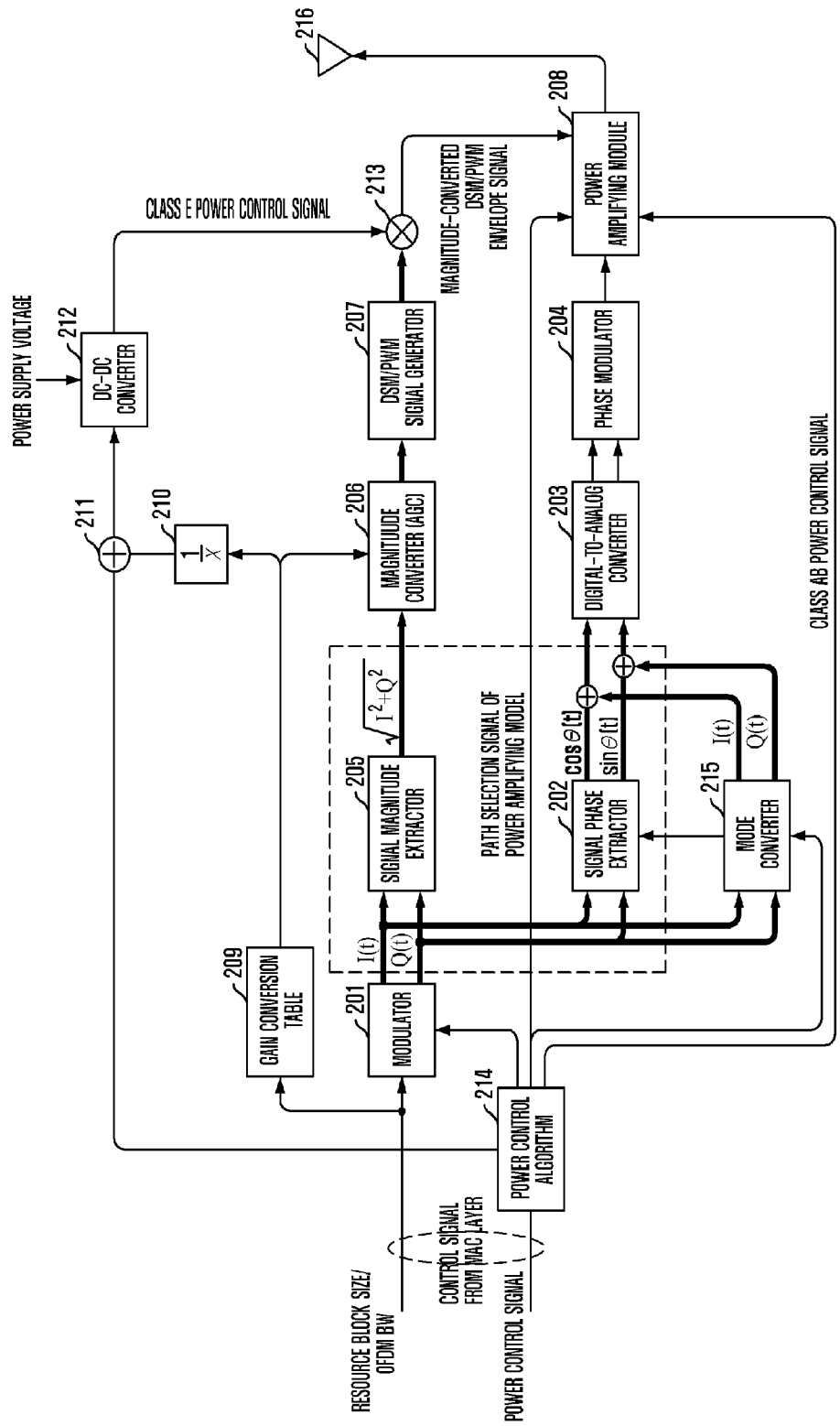
FIG. 2 is a block diagram of a polar transmitter in accordance with an embodiment of the present invention.

FIG. 2 is a block diagram of a polar transmitter in accordance with an embodiment of the present invention.

Referring to FIG. 2, the polar transmitter in accordance with an embodiment of the present invention includes a transmission signal generating unit, a gain correcting unit, a gain controlling unit, and a power amplifying module.

First, the transmission signal generating unit includes a modulator 201, a signal phase extractor 202 in a coordinate converter, a signal magnitude extractor 205 in the coordinate converter, a digital-to-analog converter 203, a phase modulator 204, a magnitude converter 206, and a Delta Sigma Modulator (DSM)/a Pulse Width Modulator (PWM) signal generator 207. Herein, the polar transmitter in accordance with an embodiment of the present invention uses one of DSM and PWM.

The gain correcting unit includes a gain conversion table 209, an inverse operator 210, an adder 211, a DC-DC converter 212, and a multiplier 213. The gain controlling unit includes a power control algorithm 214, and a mode converter 215. The power amplifying module 208 includes two or more paths having different amplification degrees, and is connected to the antenna 216.

In the polar transmitter in accordance with an embodiment of the present invention, the following description will be made on a signal generating process, a gain correcting process and a gain controlling process.

First, the signal generating process of the polar transmitter will be described. The modulator 201 receives information associated with a resource allocation and a transmission data from the upper layer. The modulator 201 establishes a physical channel by using the information associated with the resource allocation, and modulates the received transmission data into a complex digital transmission signal according to the physical channel and outputs the modulated signal.

The modulated complex digital transmission signals are the same signals as the signals described in the background art, and are also illustrated as I(t) and Q(t) like FIG. 1. The signals I(t) and Q(t), which are the complex digital signals outputted from the modulator 101, are inputted to the signal magnitude extractor 205 and signal phase extractor 202 of the coordinate converter and the mode converter 215 of the gain controlling unit. Herein, the coordinate converter separates the magnitude information and phase information of the transmission signal from the complex digital signals.

The signal magnitude extractor 205 computes the square root of the signals I(t) and Q(t) which are the complex digital signals to obtain and output a magnitude value. The output magnitude value is inputted to the magnitude converter 206 so that a gain is controlled.

At this point, the magnitude converter 206 converts the magnitude value of the complex digital signal according to a gain value output from the gain correcting unit described below. In this way, the signal having the magnitude converted by the magnitude converter 206 is inputted to DSM/PWM signal generator 207. DSM/PWM signal generator 207 generates a signal based on a DSM scheme or a PWM scheme.

The signal generated by DSM/PWM signal generator 207 based on one between the two schemes is inputted to the gain correcting unit.

The phase signal among signals separated from the coordinate converter is inputted to the signal phase extractor 202. The signal phase extractor 202 extracts a cosine value (cos $\theta(t)$) and a sine value (sin $\theta(t)$) on a phase from the signals I(t) and Q(t) which are the input complex digital signals, and outputs the extracted values.

The cosine value (cos $\theta(t)$) and the sine value (sin $\theta(t)$) output from the signal phase extractor 202 are added to information provided from the gain controlling unit, and the added digital values are inputted to the digital-to-analog converter 203. The digital-to-analog converter 203 converts the respective digital values into analog signals, and outputs the converted analog signals.

The converted analog signals are inputted to the phase modulator 204. The phase modulator 204 converts a baseband signal into an RF phase modulation signal and outputs the converted signal. The signal modulated based on phase modulation is again inputted to the power amplifying module, is amplified through it, and is radiated through the antenna 216.

In the general polar transmitter, as described in the background art, when the magnitude of the output signal of the modulator 201 is increased, the input signal of DSM/PWM signal generator 207 is changed so that performance is deteriorated. Consequently, a noise component or the magnitude of a spurious component is increased in the power spectrum of an RF signal which is finally output. Accordingly, embodiments of the present invention solve the limitations by a gain correction.

Hereinafter, the operation of the gain correcting unit will be described.

The size information of a resource block transferred from the upper layer or Orthogonal Frequency Division Multiplexing (OFDM) bandwidth information is inputted to the gain conversion table 209. The gain conversion table 209 includes a memory actually having the gain conversion table, and a controller reads pertinent gain information from the memory having the gain conversion table by using input information and outputs read information. Hereinafter, for convenience, the gain conversion table 209 will be referred to as a gain information table.

In a case where the magnitude of a signal, which is output from the modulator 201 of the signal generating unit, increases or decreases according to the degree of a resource allocation of the upper layer or the bandwidth change of a signal, the gain information table 209 outputs a gain value, which is pre-stored in it, corresponding to whether a signal magnitude is increased or decreased according to the bandwidth change of the signal and the increase or decrease degree of the signal magnitude. Such gain information is provided to the magnitude converter 206 and the inverse operator 210.

The gain value, which is generated and transferred via the above-described processes, is inputted to the magnitude converter 206 of the signal generating unit. The magnitude converter 206 converts the magnitude of a transmission signal output from the signal magnitude extractor 205 of the coordinate converter by using input gain value. Accordingly, a signal having a constant magnitude is always inputted to DSM/PWM signal generator 207 of the signal generating unit regardless of a resource allocation or a bandwidth change so that performance is not deteriorated when a signal is converted into a pulse.

Moreover, the information of a gain value, which is increased or decreased in the gain conversion table 209, is reflected by an inverse of the magnitude of the output signal of DSM/PWM signal generator 207. For this, the output signal of the gain conversion table 209 has an inverse number value of the gain value in the inverse operator 210. At this point, the signal provided from the power control algorithm 214 is added in the adder 211 and added signal is provided to the DC-DC converter 212. Then, the DC-DC converter 212 converts the input signal into a Direct Current (DC) current of a predetermined level and provides the converted DC current to the multiplier 213.

Accordingly, the multiplier 213 multiplies the DC current by a signal modulated through DSM/PWM signal generator 207, and outputs the multiplied signal to the power amplifying module 207. As a result, although the magnitude of the output signal of the modulator 201 is increased or decreased, embodiments of the present invention can correct a gain not to deteriorate the performance of DSM/PWM signal generator 207 without changing the entire gain of the transmitter.

The conventional polar transmitter varies the level of the power supply voltage of a class E amplifier or a class AB amplifier in order to vary the gain of the transmitter. However, in a case of such a scheme, a variable region is narrow and it is difficult to expect the high-efficiency of an amplifier.

The following description will be described on the operation of the gain controlling unit.

The power control algorithm 214 of the gain controlling unit of the polar transmitter in accordance with an embodiment of the present invention may generally be implemented with a processor or a programmable Application Specific Integrated Circuit (ASIC), for example, Field Programmable Gate Array (FPGA). Herein, for convenience, the power control algorithm 214 of the gain controlling unit of the polar transmitter in accordance with an embodiment of the present invention is referred to as a power control algorithm.

The power control algorithm 214 receives a gain control signal from the upper layer, and determines whether to vary the magnitude of a final output signal or the gain of the power amplifying module 208. The gain variation in the modulator 201 may be performed up to the maximum permission bit. When the output of the modulator 201 is varied by the power control algorithm 214, the control value of the gain conversion table 209 is properly varied in the gain correction process. That is, the power amplifying module 208 will be described below with reference to FIG. 3.

To provide a brief description, the description of the power amplifying module 208, however, may be classified into a case where it simply amplifies only a power without the distortion of a signal and a case where it amplifies a signal in spite of the distortion of the signal. Moreover, even in a case where the power amplifying module 208 allows a signal not to be distorted, the power amplifying module 208 minimizes the amplification value of a power when it merely controls the output gain of the modulator 201, thereby satisfying this.

The power amplifying module 208 may select two paths according to the threshold value of a transmission power in order to vary a transmission gain. That is, the gain controlling unit may perform a transmission gain control from the maximum transmission output to a threshold transmission output in a mode where it varies the gain of a class E/F power amplifier by approximately 20 dB using a DSM signal or a PWM signal.

The gain controlling unit may perform a transmission gain control from the threshold transmission output to the minimum transmission outputted by varying the gain of a class AB power amplifier by approximately 40 dB. In addition, the gain controlling unit may control a gain by merely controlling only the output of the modulator 201. In this case, the power amplification of the class AB power amplifier is performed corresponding to the output of the modulator 201. Such a power amplification value is controlled according to a value output from the power control algorithm 214.

For this, the mode converter 215 directly applies the output of the modulator 201 to the digital-to-analog converter 203 and operates a general direct conversion transmitter. In this way, the gain controlling unit expands a range of a power control and operates a power amplifier suitable for a transmission output, thereby enhancing the efficiency of the transmitter.

Accordingly, the pulse signal multiplied by the power control signal in the power amplifying module 208 is inputted to the power amplifier. The power control algorithm 214 receives the path signal of the power amplifying module 208 and amplifies the output of the phase modulator 204. At this point, when the class AB power amplifier is selected in the power control algorithm 214, a class AB power control signal is additionally applied to the power amplification module 208. Accordingly, the power amplifying module 208 receives a phase-modulated RF signal as an input, receives a magnitude-converted magnitude pulse signal based on the DSM or PSM as a power supply voltage, amplifies a power by the selected power amplifier, and thereafter radiates the amplified signal through the antenna 216.

Figure 3:
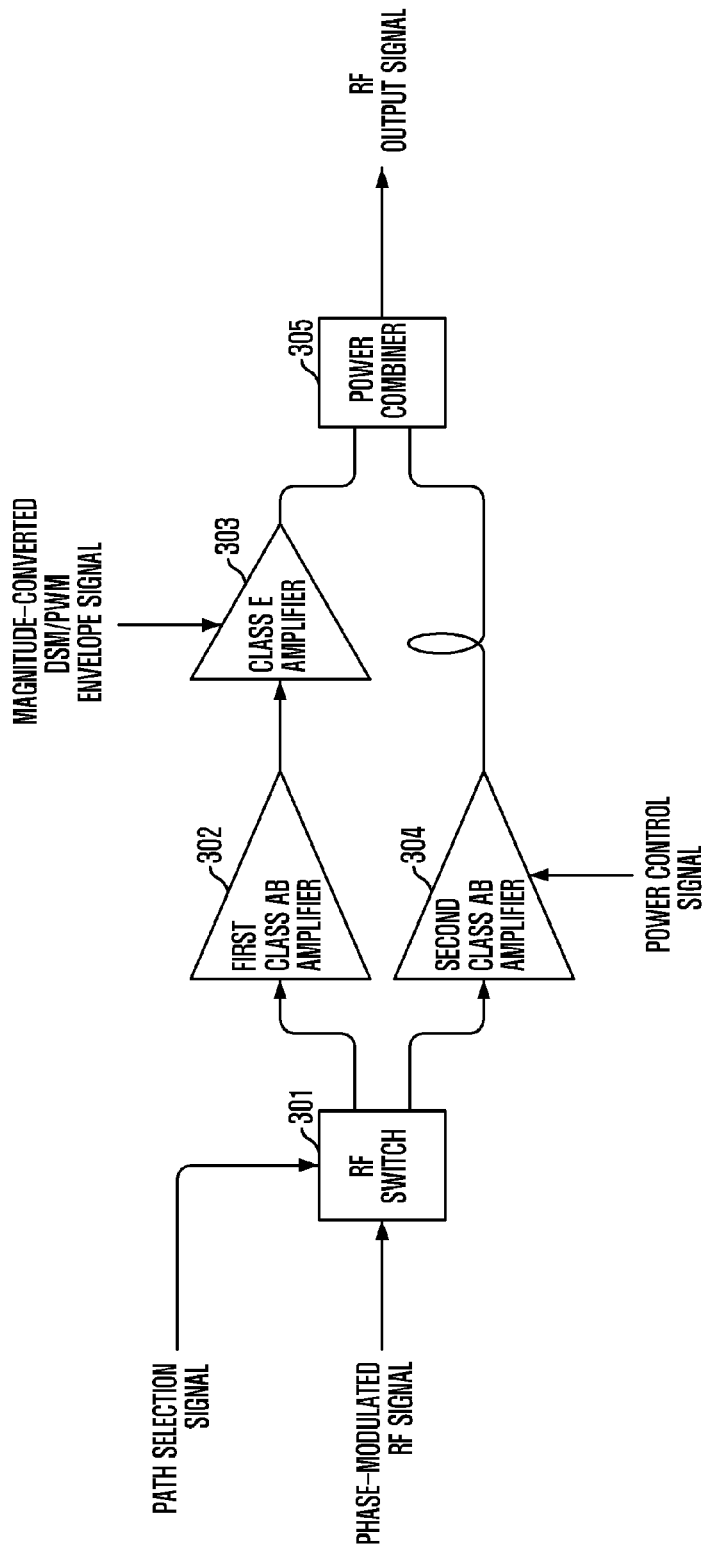
FIG. 3 is a block diagram of a power amplifying module of the polar transmitter in accordance with an embodiment of the present invention.

FIG. 3 is a block diagram of the power amplifying module of the polar transmitter in accordance with an embodiment of the present invention.

Referring to FIG. 3, the power amplifying module 208 includes an RF switch 301, a first class AB amplifier 302, a class E amplifier 303, a second class AB amplifier 304, and a power combiner 305.

The phase-modulated RF signal is inputted to the RF switch 301. The RF switch 301 outputs the signal inputted by a path selection signal to a first or second path. Herein, the first path denotes a path which passes through the first class AB amplifier 302 and the class E amplifier 303, and the second path is a path which passes through the second class AB amplifier 304.

As described above with reference to FIG. 2, the power control algorithm 214 selects the path according to the level of a transmitted output power. That is, the power amplifying module 208 uses the DSM signal or the PWM signal as a power supply voltage from the maximum transmission output to the threshold transmission output and simultaneously controls the magnitude of the pulse power supply signal by approximately 20 dB, and thus performs a transmission gain control in the mode of varying the gain of the class E/F power amplifier to thereby enable to operate in the maximum efficiency section.

On the other hand, since the efficiency of the class E/F power amplifier is not good from the critical transmission output to the minimum transmission output, the power amplifying module 208 varies the power supply voltage of the second class AB power amplifier 304 by approximately 40 dB to thereby perform a transmission gain control. RF output signals, which are transmitted through different paths according to the control range of a transmission gain, are combined by the power combiner 305, and the combined signal is transmitted to the antenna 216.

Figure 4:
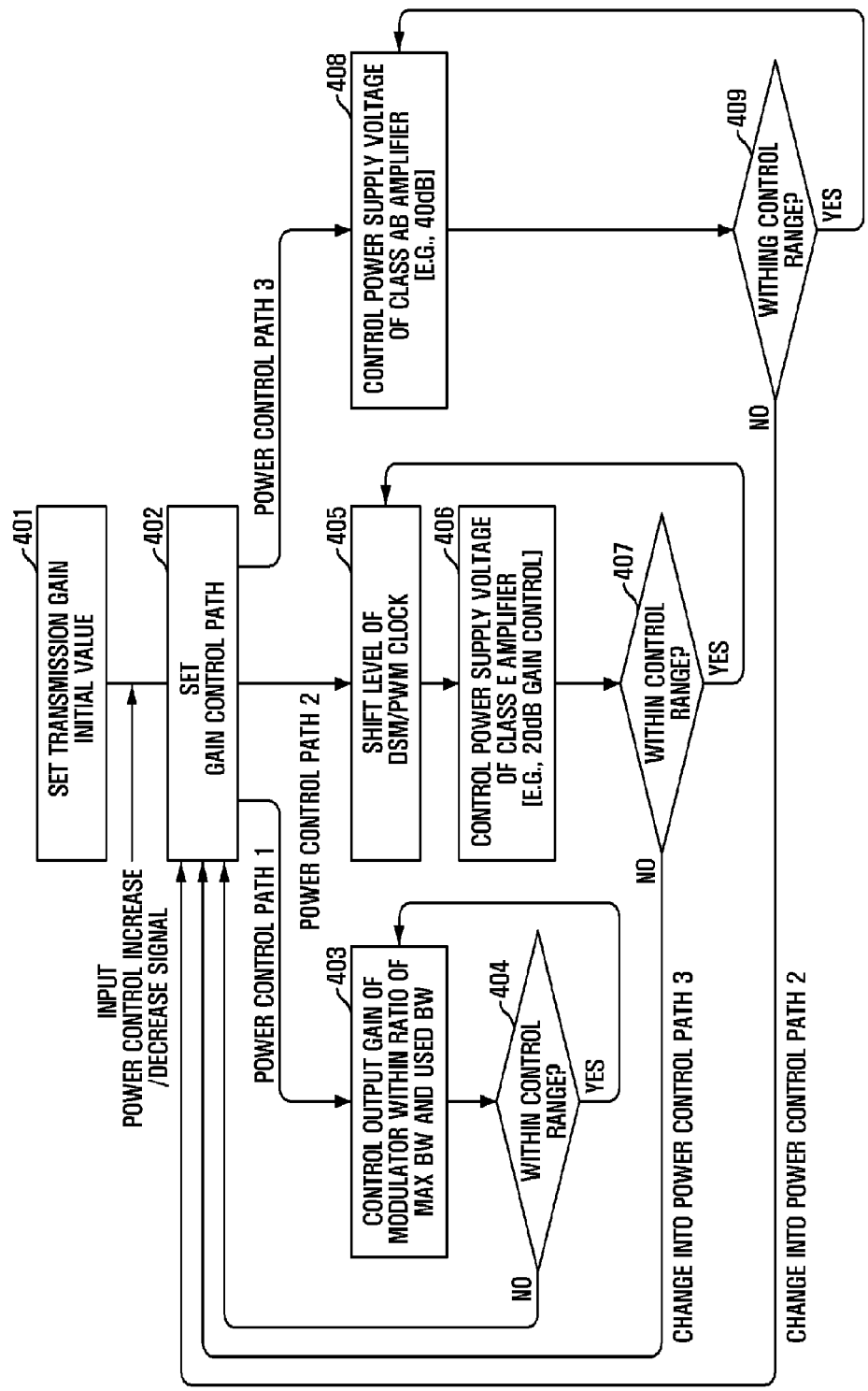
FIG. 4 is a flowchart illustrating a method for controlling a gain in the polar transmitter in accordance with an embodiment of the present invention.

FIG. 4 is a flowchart illustrating a method for controlling a gain in the polar transmitter in accordance with an embodiment of the present invention.

Referring to FIG. 4, when the power supply voltage of a terminal having the polar transmitter is applied, the power control algorithm 214 sets the initial value of a transmission gain in operation S401. The initial value may be a value pre-stored in the terminal, and may also be determined using the signal level of a power which is received upon initial operation of the terminal.

In this way, when the initial value of the transmission gain is determined, the power control algorithm 214 determines a gain control path according to the initial value in operation S402. In embodiments of the present invention, the gain control path includes three paths. A power control path 1 being the first path is used to control the output gain of the modulator within the ratio of the maximum bandwidth and a used bandwidth. A power control path 2 being the second path is used to control the power of the class E/F amplifier by shifting the level of a DSM or PWM clock. A power control path 3 being the third path is used to control the power of the class AB power amplifier.

Accordingly, the power control algorithm 214 proceeds to a succeeding operation according to a determined gain path. First, when the first path is selected, the power control algorithm 214 suitably controls the output of the modulator within the ratio of the maximum bandwidth and the used bandwidth in operation S403. Furthermore, the power control algorithm 214 checks whether the control range is a suitable range in operation S404. When the control range is not the suitable range as a result of the check, the power control algorithm 214 newly determines a gain control path.

When the determined gain path is the second power control path, the power control algorithm 214 shifts the level of the DSM/PWM clock in operation S405. The power control algorithm 214 controls the power supply voltage of the class E amplifier in operation S406. In embodiments of the present invention, in a case that controls a gain as the second path, the power control algorithm 214 may control the gain by approximately 20 dB.

In this way, in a case where a power control is performed through the second power control path, the power control algorithm 214 checks whether a current transmission power exists within a power control range in operation S407. When a controlled range is not within a gain range as a result of the check, the power control path is changed into the power control path 3, and the power control algorithm 214 proceeds to the operation S402 and controls a gain according to a new gain control path.

Finally, when the determined gain path is the third power control path, the power control algorithm 214 controls a gain by controlling the power supply voltage of the class AB power amplifier in operation S408. In embodiments of the present invention, a gain control according to the third path may be performed by approximately 40 dB.

In this way, after the control of the power supply voltage of the power amplifier, the power control algorithm 214 checks whether the current controlled range of the power supply voltage is within a range controllable by the class AB amplifier in operation S409. When the check result shows that the current controlled range of the power supply voltage is not within the range controllable by the class AB amplifier, the power control algorithm 214 selects the power control path 2, and proceeds to the operation S402 for the determination of the gain control path to thereby perform a gain control again.

As described above, a method is basically used that controls only the output gain of the modulator within the maximum bandwidth and the used bandwidth. When the polar transmitter controls a gain in such a method and then the gain is equal to or greater than a specific threshold value, the polar transmitter uses the class AB power amplifier and the class E/F power amplifier. At this point, the polar transmitter uses a method that controls the gain of the class E/F power amplifier with a DSM/PWM envelope signal. However, when the gain is less than the specific threshold value, the polar transmitter can variously control the gain by controlling only the gain of the class AB power amplifier.

FIGS. 5 to 8 are graphs illustrating the simulation result of a power spectrum in a case that uses the polar transmitter in accordance with an embodiment of the present invention.

Figure 5:
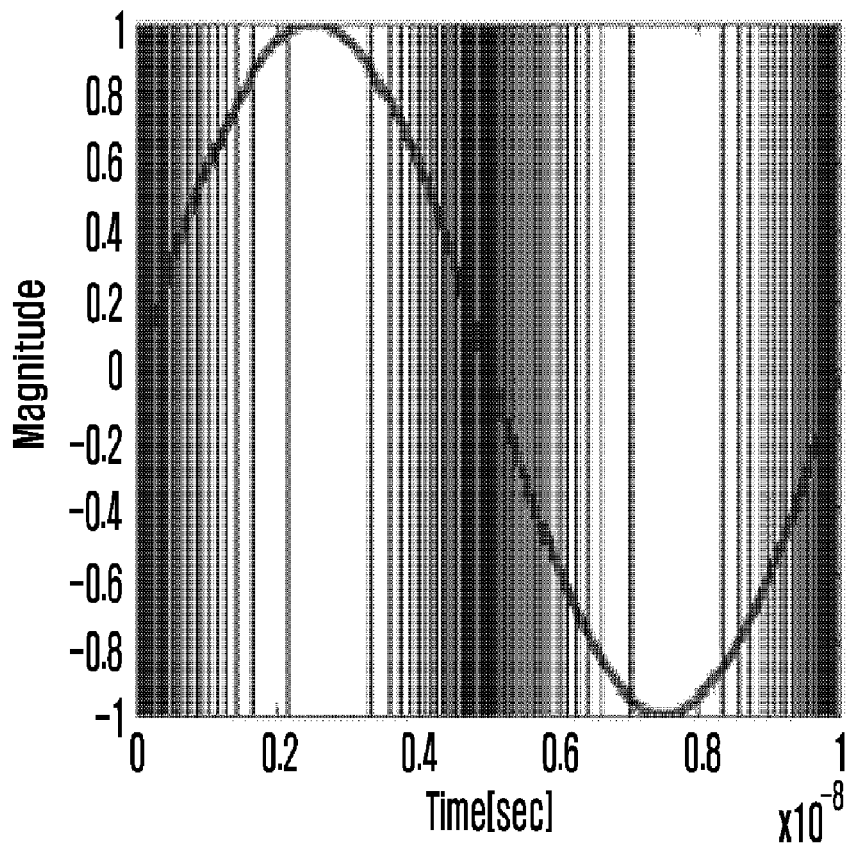
FIGS. 5 to 8 are graphs illustrating the simulation result of a power spectrum in a case that uses the polar transmitter in accordance with an embodiment of the present invention.
Figure 6:
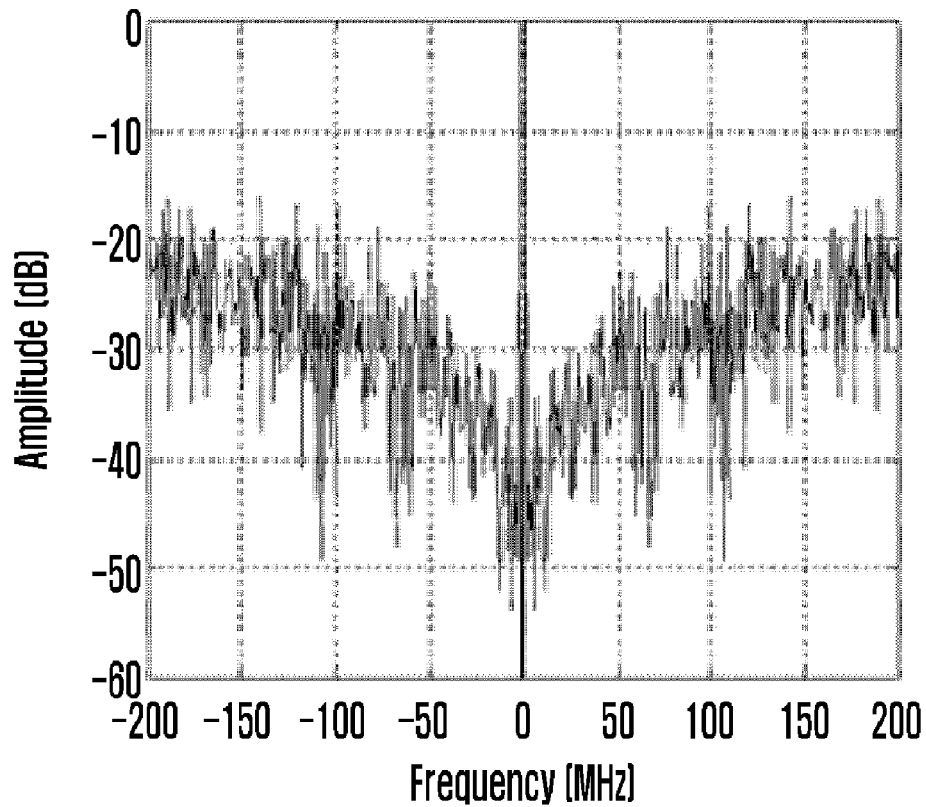
Figure 7:
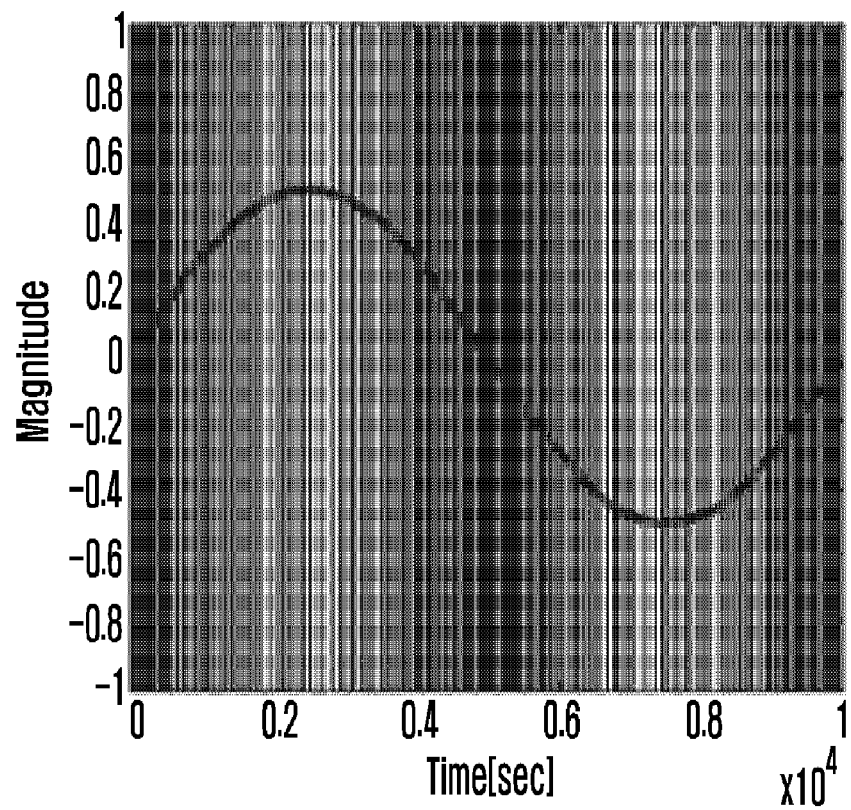
Figure 8:
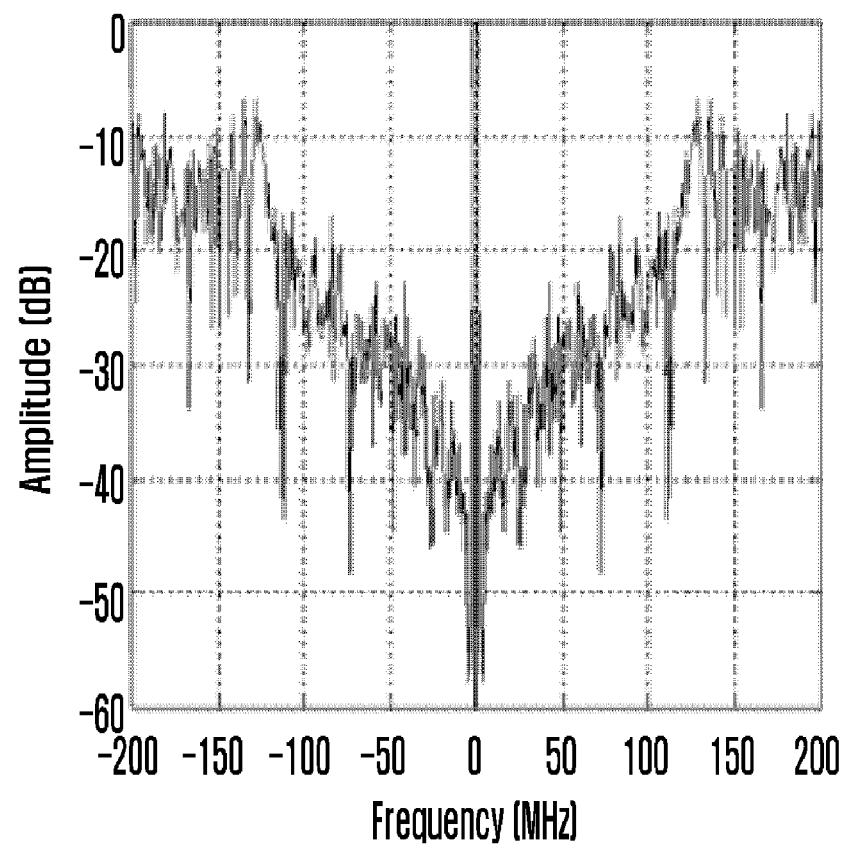

FIG. 5 illustrates a waveform of a pulse-modulated signal in a case where the magnitude of a signal is very suitable for the input level of the delta sigma modulator, on the assumption of that a baseband signal is a sine wave of one cycle. FIG. 6 illustrates a spectrum of a frequency domain in a case of FIG. 5. FIG. 7 illustrates a pulse-modulated waveform in a case where the magnitude of the baseband signal is less than the input level of the delta sigma modulator by approximately a half level. FIG. 8 illustrates a spectrum of a frequency domain in a case of FIG. 7.

Comparing the spectrum of the frequency domain in FIG. 6 with that of FIG. 8, a noise of approximately 10 dB increases in a case where the magnitude of an input signal is less than a suitable level by approximately a half level. Accordingly, it can be seen that a process is required in which the output level of the modulator 201 of FIG. 2 is corrected at the input level of the delta sigma modulator.

The present application contains subject matter related to Korean Patent Application No. 2008-0120954, filed in the Korean Intellectual Property Office on Dec. 2, 2008, the entire contents of which is incorporated herein by reference.

While the present invention has been described with respect to the specific embodiments, it will be apparent to those skilled in the art that various changes and modifications may be made without departing from the spirit and scope of the invention as defined in the following claims.

The invention claimed is:

1. An apparatus for controlling gain according to a magnitude change of an output signal in a polar transmitter, the apparatus comprising:
a signal generating unit configured to receive and modulate a transmission signal, separate the modulated signal into a phase signal and a magnitude signal, generate a pulse signal by using the magnitude signal, and convert the phase signal into a wireless signal;
a gain correcting unit configured to extract a transmission gain from magnitude information of a resource block of the transmission signal, provide a gain value to the signal generating unit, and generate an envelope signal for a power amplification by using the pulse signal of the signal generating unit;
a power amplifying module configured to receive the envelope signal, and perform a power amplification or a simple amplification according to a selection signal and the envelope signal; and
a gain controlling unit configured to determine a magnitude of a signal generated by the signal generating unit by using a power control signal for the transmission signal, determine a gain mode, and output the selection signal.

2. The apparatus of claim 1, wherein the signal generating unit comprises:
a modulator configured to modulate the transmission signal by controlling a magnitude of the modulation signal according to a gain control signal received from the gain controlling unit;
a coordinate converter configured to separate the signal modulated by the modulator into a phase signal and a magnitude signal, and output the phase signal and the magnitude signal;

a magnitude converter configured to convert a magnitude of the magnitude signal using the gain value provided from the gain correcting unit; and a phase modulator configured to modulate a phase of the phase signal.

3. The apparatus of claim 1, wherein the gain correcting unit comprises:

a gain conversion table configured to extract the transmission gain from the magnitude information of the resource block of the transmission signal to generate the gain value;

an inverse operator configured to compute an inverse number value of the gain value;

an adder configured to add the computed inverse number value to the power control value;

a DC-DC converter configured to output the power control signal for controlling a magnitude of an input power supply signal according to the added value; and a mixer configured to mix an output of the signal generating unit with the power control signal to output the envelope signal.

4. The apparatus of claim 1, wherein the gain controlling unit comprises:

a power control algorithm configured to generate a path selection signal, power control value and mode conversion signal of the power amplifying module according to the power control signal of the transmission signal; and a mode converter configured to generate and output a mode conversion signal from the modulated signal.

5. The apparatus of claim 1, wherein the power amplifying module performs a power control according to the envelope signal when a power of the transmission signal is equal to or greater than a predetermined threshold value;

the power amplifying module performs a class AB power amplification when the power of the transmission signal is less than the threshold value;

the power amplifying module performs a simple amplification.

6. The apparatus of claim 5, wherein the gain controlling unit comprises a gain control algorithm, wherein the gain control algorithm generates a class AB power amplification signal.

7. The apparatus of claim 4, wherein the power amplifying module performs a power control according to the envelope signal when a power of the transmission signal is equal to or greater than a predetermined threshold value;

the power amplifying module performs a class AB power amplification when the power of the transmission signal is less than the threshold value;

the power amplifying module performs a simple amplification.

8. The apparatus of claim 7, wherein the gain controlling unit comprises a gain control algorithm, wherein the gain control algorithm generates a class AB power amplification signal.

* * * * *